United States Patent
Tang et al.

(10) Patent No.: US 7,659,204 B2
(45) Date of Patent: Feb. 9, 2010

(54) OXIDIZED BARRIER LAYER

(75) Inventors: Xianmin Tang, San Jose, CA (US); Hua Chung, San Jose, CA (US); Rongjun Wang, Cupertino, CA (US); Praburam Gopalraja, San Jose, CA (US); Jick M. Yu, San Jose, CA (US); Jenn Yue Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 107 days.

(21) Appl. No.: 11/691,302

(22) Filed: Mar. 26, 2007

(65) Prior Publication Data

US 2008/0237029 A1   Oct. 2, 2008

(51) Int. Cl.
*H01L 21/44* (2006.01)

(52) U.S. Cl. ............... 438/679; 438/637; 438/683; 438/686; 257/E21.169

(58) Field of Classification Search .......... 438/679, 438/683, 686, 637
See application file for complete search history.

(56) References Cited

U.S. PATENT DOCUMENTS

| | | | |
|---|---|---|---|
| 7,300,869 B2 * | 11/2007 | Sun et al. .................. 438/648 |
| 2004/0099215 A1 * | 5/2004 | Danek et al. ............ 118/723 E |
| 2005/0211548 A1 | 9/2005 | Gung et al. ............ 204/192.12 |
| 2005/0263390 A1 | 12/2005 | Gung et al. ............ 204/192.15 |
| 2006/0030151 A1 | 2/2006 | Ding et al. ................. 438/687 |
| 2006/0076232 A1 | 4/2006 | Miller et al. ........... 204/192.12 |
| 2006/0251872 A1 | 11/2006 | Wang et al. .............. 204/192.1 |

* cited by examiner

*Primary Examiner*—Alexander G Ghyka
(74) *Attorney, Agent, or Firm*—Law Office of Charles Guenzer

(57) ABSTRACT

A method and resultant produce of forming barrier layer based on ruthenium tantalum in a via or other vertical interconnect structure through a dielectric layer in a multi-level metallization. The RuTa layer in a RuTa/RuTaN bilayer, which may form discontinuous islands, is actively oxidized, preferably in an oxygen plasma, to thereby bridge the gaps between the islands. Alternatively, ruthenium tantalum oxide is reactive sputtered onto the RuTaN or directly onto the underlying dielectric by plasma sputtering a RuTa target in the presence of oxygen.

11 Claims, 6 Drawing Sheets

OXIDIZED BARRIER LAYER

FIELD OF THE INVENTION

The invention relates generally to sputter deposition in the formation of integrated circuits. In particular, the invention relates to sputter deposition of barrier layers in inter-level interconnects.

BACKGROUND ART

Advanced integrated circuits include multiple levels of wiring separated by inter-level dielectric layers. Vias are etched in the dielectric layers and are filled with a metallization to vertically connect the different levels of horizontal interconnections. Currently copper is the preferred metallization metal and is often used in dual-damascene interconnect structure in which the dielectric layer is etched in a two-step process to have narrow vertically extending vias etched in the lower part of the dielectric layer and wider horizontally extending trenches etched in the upper part of the dielectric layer typically interconnecting different ones of the vias. Copper is then filled into both the vias and trenches by electrochemical plating (ECP) and chemical mechanical polishing removes the excess copper plated above the trenches and over the remainder of the wafer which is not patterned with the dual-damascene structure.

However, a more complex structure is required for the fabrication and reliable operation of a integrated circuit incorporating copper metallization. The cross-sectional view of FIG. 1 illustrates a simple via 10. It like the more complicated dual-damascene structure requires additional layers beyond the copper metallization itself. A lower dielectric layer 12 is formed with a conductive feature 14 in its upper surface, which may be a copper-filled trench in the dual-damascene metallization of the lower dielectric layer 12. An upper dielectric layer 16 is deposited over the lower dielectric layer 12 and its conductive feature 14. In the recent past, the dielectric material was typically silicon dioxide, but more recently low-k dielectric materials have been implemented, such as hydrogenated oxysilicon carbide. The via 10 is then etched in the upper dielectric layer 16 to overlie the conductive feature 14. A barrier is required between the copper to be filled into the via and the dielectric material to prevent the migration of copper into the dielectric, which would increase its conductivity and create a reliability problem. A common barrier structure includes a tantalum nitride (TaN) layer 18 and a tantalum (Ta) layer 20. The TaN and Ta layers 18, 20 need to cover the sidewalls of the via 10 but preferably do not cover its bottom in order to reduce the contact resistance to the copper conductive feature 14. A copper seed layer 22 is deposited over the barrier layer 18, 20 to serve as a plating electrode and nucleation layer for the copper to be later plated into the via 10. Thereafter, the wafer is moved to the electroplating apparatus to fill the via 10 (and the trench in the upper portion of the dielectric layer 16 in the case of dual damascene) with copper.

The Ta(N) barrier layers 18, 20 and the copper seed layer 22 are all advantageously deposited by sputtering. Tantalum nitride may be sputter deposited in the same sputter chamber as the tantalum layer by reactive sputtering, in which nitrogen is admitted into the chamber to react with the tantalum atoms sputtered from the target to form tantalum nitride. Even though sputtering is a ballistic process ill suited to coating the sides of a narrow, deep hole, that is, one have a high aspect ratio, advances in sputtering technology have circumvented the problem and allowed the continued use of sputtering for further generations of integrated circuits. However, the challenges continue to mount as the via widths decrease and the aspect ratio of the vias increase. These problems arise in part by the requirement that the barrier layers be relatively thin, for example, a few nanometers as the via widths decrease to well below 40 nm. Recently, Jenn Yue Wang et al. and Ronjun Wang et al. have respectively suggested in U.S. patent application publication 2006/0251872 and U.S. patent application Ser. No. 11/511,869, filed Aug. 29, 2006, that the tantalum barrier be replaced by a tantalum ruthenium barrier. Barriers of tantalum ruthenium with high ruthenium fraction have the advantage that if the copper seed layer is discontinuous, tantalum ruthenium, even if oxidized during transfer to electroplating apparatus, is sufficiently conductive to serve at least partially as the electrode layer for electroplating.

However, a sputtered tantalum ruthenium barrier presents problems of its own. It is greatly desired to produce a barrier layer, particularly one of ruthenium tantalum, that presents an effective barrier to the after coated and plated copper. It is also greatly desired that RuTa(N) barrier layer be deposited by sputtering even though the width of the via holes has decreased and their aspect ratio increased.

SUMMARY OF THE INVENTION

The invention includes a barrier liner formed in a via or other vertical interconnect through a dielectric layer in a multi-level metallization structure in which the barrier is based on ruthenium tantalum in an atomic ratio of between 50:50 and 95:5 and preferably between 70:30 and 90:10 in which a surface layer of ruthenium tantalum oxide is formed.

In one embodiment, metallic ruthenium tantalum is deposited on the via sidewalls, preferably by plasma sputtering but it may form in islands. The ruthenium tantalum is preferably deposited on an intermediate layer of ruthenium tantalum nitride. The metallic layer is actively oxidized to form ruthenium tantalum oxide. The oxidation may be performed in an oxygen plasma, either locally or remotely generated.

In another embodiment, ruthenium tantalum nitride is reactive sputtered from a ruthenium tantalum target in the presence of oxygen.

The ruthenium tantalum and its nitride and oxide may be deposited in a same plasma sputter chamber and the barrier at the via bottom may also be punched through in the same chamber.

DETAILED DESCRIPTION OF THE PREFERRED EMBODIMENTS

Figure 1:
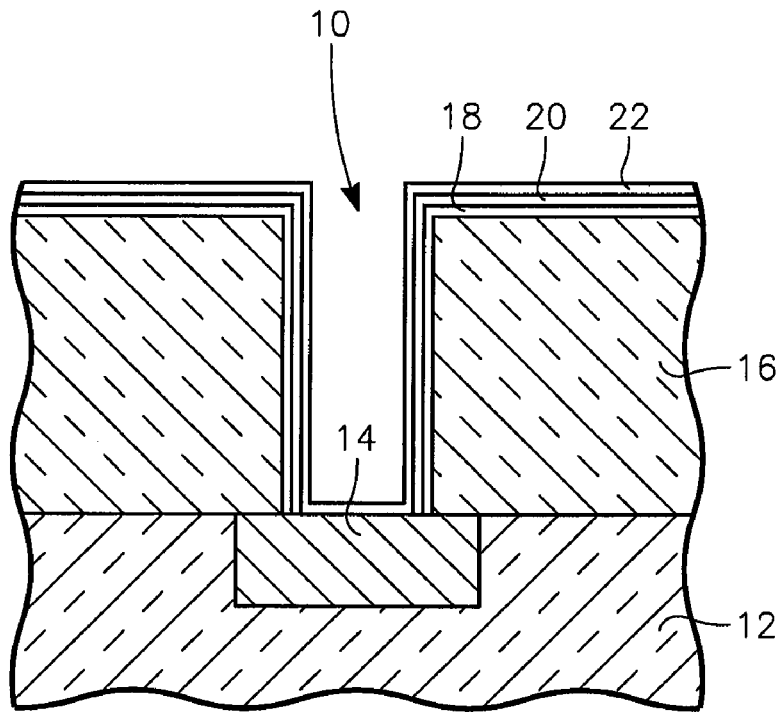
FIG. 1 is a cross-sectional view of an idealized via liner structure including a ruthenium tantalum barrier layer and a copper seed layer.

We have observed that thin layers of ruthenium tantalum tend to deposit on the sidewalls of the vias to have a roughened surface. Pure tantalum seems to sputter deposit with a smoother surface than ruthenium tantalum. In the extreme, as illustrated in the cross-sectional view of FIG. 2, ruthenium tantalum deposits on the ruthenium tantalum nitride layer 18 as isolated RuTa islands 26 with gaps 28 between them. When copper is then sputter deposited, although some of it lands on the ruthenium tantalum nitride layer 18, it does not well adhere to the nitride material but instead forms a poor, possibly discontinuous copper seed layer 30 is formed, as illustrated in FIG. 3, with some of the gaps 28 remaining to expose the underlying ruthenium tantalum nitride layer 18. As a result, when copper is electroplated to fill the remainder of the via hole 10, the gaps in the copper seed layer 30 may interrupt the electroplating current and the exposed ruthenium tantalum nitride does not well nucleate the ECP copper.

Some manufacturers prefer to dispense with the tantalum nitride layer 18 and to rely completely on the tantalum metal for a barrier. In this case, as illustrated in the cross-sectional view of FIG. 4, if the ruthenium tantalum deposits as RuTa islands 32 with gaps 34 therebetween, a copper seed layer 36 partially deposits directly on the dielectric 16 and no barrier exists between them so that the copper can deleteriously diffuse into the dielectric 16.

In some applications, it is possible to use the ruthenium tantalum layer as a plating electrode for the ECP copper and to dispense with the copper seed layer. In this case, if the ruthenium tantalum forms islands 26, 32, it is discontinuous as does not effectively act as a plating electrode and further the exposed ruthenium tantalum nitride does not effectively nucleate the ECP copper.

The islands 26, 32 are believed to form because of the tendency of metals to agglomerate when being deposited on materials, such as the ruthenium tantalum nitride, to which they do not wet well such that surface tension instead causes the deposited material to ball up. If the metal is deposited to a greater thickness, the islands will coalesce. However, for the very thin barrier layers required in advanced integrated circuits, the isolated islands 26, 32 remain at the end of barrier deposition.

Figure 5:
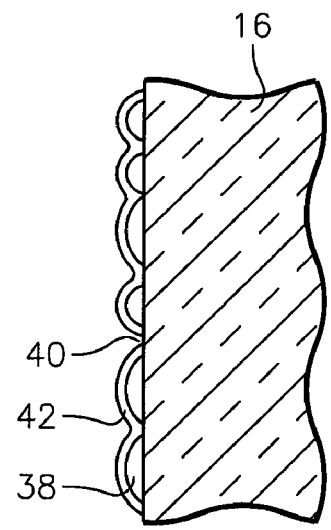
FIG. 5 is a cross-sectional view of yet another via liner structure having a barrier of ruthenium tantalum and its nitride showing the roughness of the nitride layer between islands by a subsequent thin layer of ruthenium tantalum.

Ruthenium tantalum nitride seems to form a smoother surface, probably because the reactive nitrogen is readily available in the narrow vias during sputtering and because nitrides wet better to oxide dielectrics. However, even nitrides seem to be subject to surface roughness and isolated islands. As illustrated in the cross-sectional view of FIG. 5, when the ruthenium tantalum nitride sputter deposits as isolated islands 38 with gaps 40 between them, a ruthenium tantalum layer 42 is preferentially coated on the RuTaN islands 38 but does not wet well to the underlying dielectric layer 16 exposed in the gaps 40. In many cases, the RuTa layer 42 may bridge the gaps 40 between the RuTaN islands 38 but, in other cases, even the coated RuTaN islands 38 do not coalesce and some gaps 40 may remain in which the underlying dielectric layer 16 is exposed. As a result, as illustrated in the cross-sectional view of FIG. 6, when a copper seed layer 44 is then deposited, no barrier exists in the unbridged gaps 40 there and the after deposited copper seed layer 44 directly contacts the dielectric layer 16.

According to the invention, the ruthenium tantalum agglomeration and resulting surface roughness can in large part be eliminated by oxidizing the ruthenium tantalum either ex situ after deposition or in situ during sputter deposition. Ruthenium tantalum is a preferred metallization because of its resistance to oxidation. The ruthenium tantalum preferably is deposited in its metallic form or in its oxide or nitride form with an atomic ratio of the ruthenium to the tantalum of between 50:50 and 95:5 in order to provide the advantageous conductivity and resistance to oxidation provided by the ruthenium without being excessively subject to fracture. A narrower preferred range is a Ru/Ta ratio of between 70:30 and 90:10. The RuTa metal alloy may additional include up to 10 at % of the total composition of other metals or dopants. However, the high ruthenium content seems to necessitate a positive and definite oxidation step. Room-temperature ambient oxidation does not seem sufficient.

Figure 7:
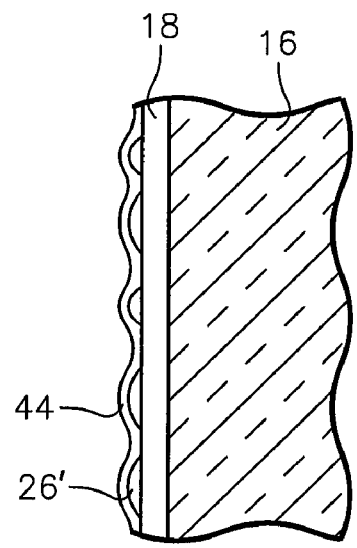
FIG. 7 is a cross-sectional view of a bridging barrier layer formed according to the invention by oxidizing the barrier of FIG. 2.
Figure 8:
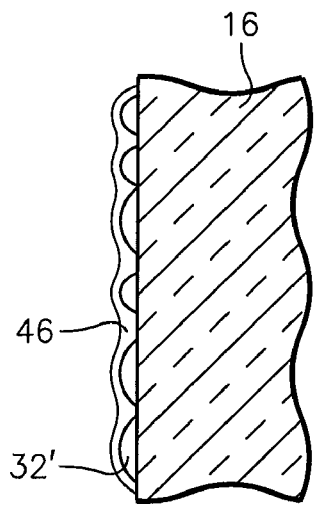
FIG. 8 is a cross-sectional view of a bridging barrier layer formed according to the invention by oxidizing the barrier of FIG. 4.
Figure 9:
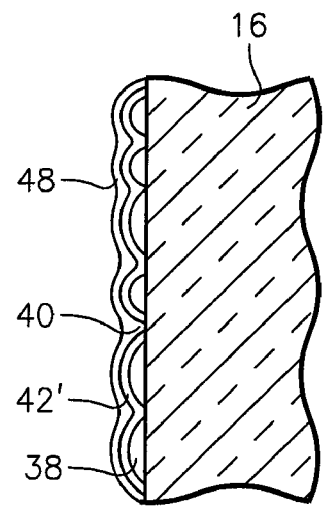
FIG. 9 is a cross-sectional view of a bridging barrier layer formed according to the invention by oxidizing the barrier of FIG. 5.

The oxidation process may convert at least surface portions of the already deposited RuTa into ruthenium tantalum oxide (RuTaO). Beginning with the structure of FIG. 2, the ex situ oxidation is relatively ineffective against the ruthenium tantalum nitride layer 18 but instead oxidizes the surface of the RuTa islands 26 to form, as illustrated in the cross-sectional view of FIG. 7, to form a conformal ruthenium tantalum oxide layer 44, which tends to bridge any gaps between the RuTa islands 26, which are now depleted RuTa islands 26' because they have been partially consumed by the oxidation. Similarly, beginning with the structure of FIG. 4, the ex situ oxidation oxidizes part of the RuTa layer 36 to form, as illustrated in the cross-sectional view of FIG. 8, a ruthenium tantalum oxide layer 46, which depletes the non-bridging RuTa layer 36 to a depleted RuTa layer 36' but tends to close the gaps and create a continuous RuTaO layer 38. Also similarly, beginning with the structure of FIG. 5 before the copper seed layer, the ex situ oxidation oxidizes part of the RuTa islands 42, as illustrated in the cross-sectional view of FIG. 7, to form depleted RuTa islands 32' and a ruthenium tantalum oxide layer 46, which is effective at bridging the gaps 34 between the prior RuTa islands 32.

The bridging of the gaps by the oxidation is promoted by the thermodynamics of oxidation and the wetting of the oxide to the underlying nitride or dielectric oxide, thus promoting the planarization and non-balling of the oxide product. The bridging proceeds from the already deposited ruthenium tantalum islands and is partially driven by the increased molar volume of the oxide. For example, the molar volumes of Ru and $RuO_2$ are respectively 8.27 and 19.94 $cm^3$ and tantalum follows the same trend so that the oxidized material grows out from the metal islands. Further, ruthenium tantalum oxide is itself a very effective barrier to copper towards the oxide dielectric.

Figure 2:
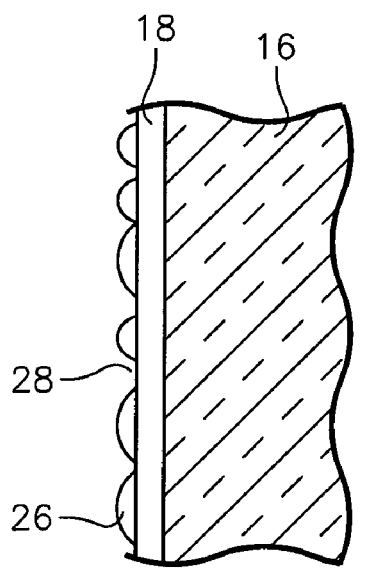
FIG. 2 is a cross-sectional view of a more realistic via liner structure having a barrier of ruthenium tantalum and its nitride showing the sidewall film roughness of a thin layer of ruthenium tantalum which has divide the film into islands.
Figure 3:
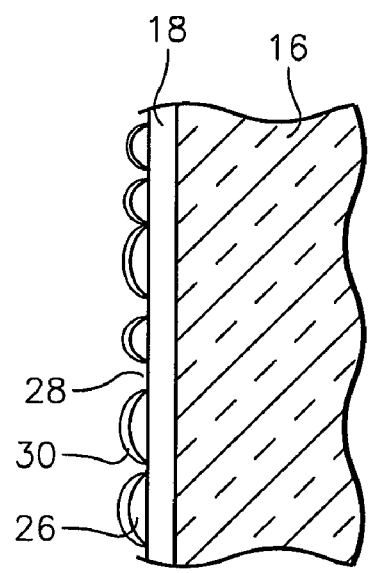
FIG. 3 is a cross-section view showing the copper seed layer deposited on the ruthenium tantalum layer of FIG. 2.
Figure 4:
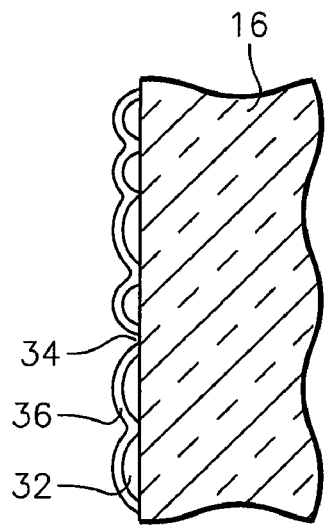
FIG. 4 is a cross-sectional view of another via liner structure having a barrier of only ruthenium tantalum and showing the surface roughness of a thin layer of ruthenium tantalum and the contact of the copper seed layer to the dielectric.
Figure 6:
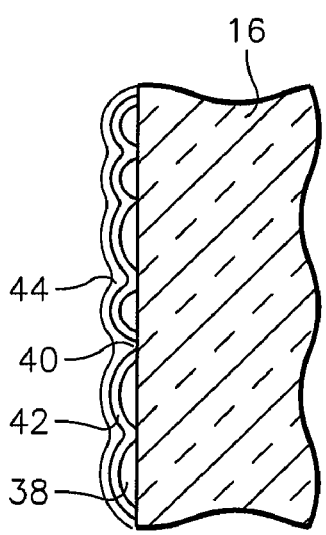
FIG. 6 is a cross-sectional view showing the copper seed layer deposited on the ruthenium tantalum layer of FIG. 5.
Figure 10:
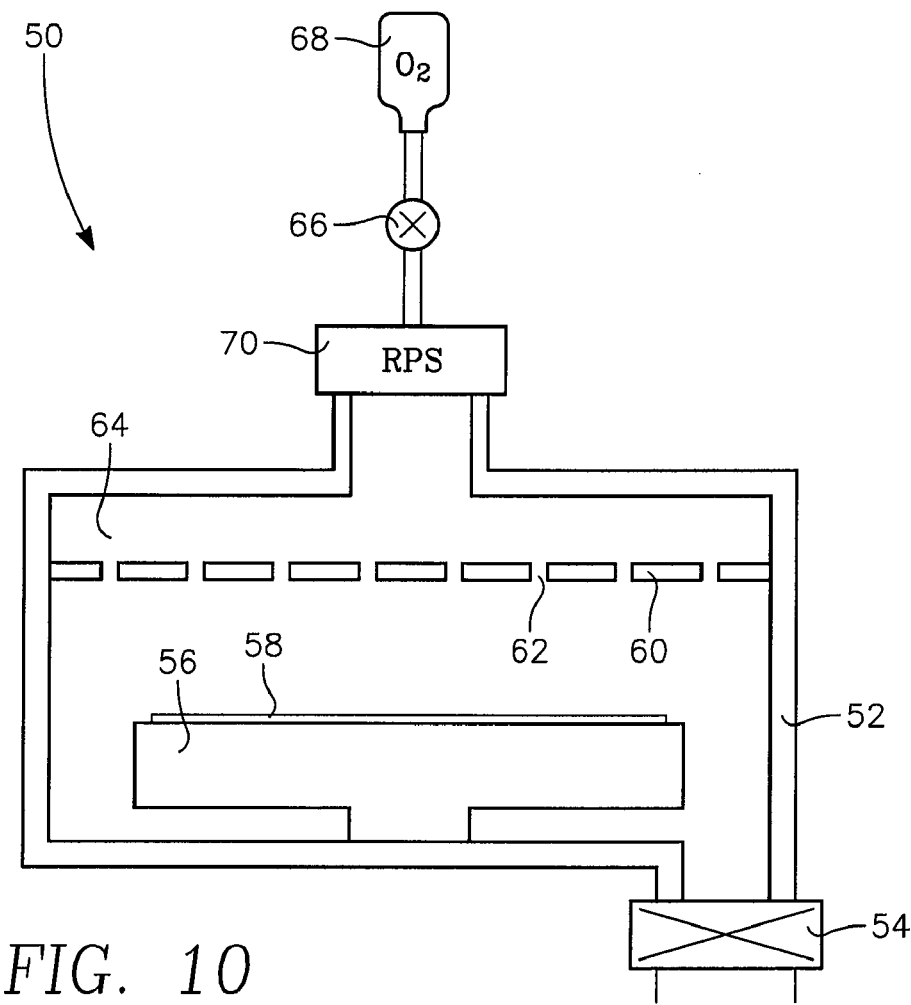
FIG. 10 is a cross-sectional view of a plasma oxidizing reactor which includes a remote plasma source for ex situ oxidation of the invention.

In ex situ oxidation, after the structure without a copper seed layer of either FIGS. 2, 4, or 6 is deposited in a RuTa sputter chamber, the wafer may be moved to a separate oxidation chamber, such as the oxygen plasma chamber 50 schematically illustrated in FIG. 10. A vacuum chamber 52 is pumped by a vacuum pump system 54 to a moderately low pressure. A pedestal 56 supports a wafer 58 to be oxidized within the chamber 52 in opposition to a showerhead 60 having multiple apertures 62 supplying a uniform flow of processing gas from a gas manifold 64. A mass flow controller 66 meters oxygen gas from an oxygen gas source 68 to a remote plasma source 70, which excites the oxygen into a plasma and supplies it to the manifold 64. The separation of the remote plasma source 70 from the interior of the chamber 52 allows the filtering of most of oxygen ions so that primarily oxygen radicals are supplied into the vacuum chamber 52 to provide a soft oxidation of the wafer 58. Other types of oxidation chambers may be substituted, such as pre-clean chambers having a decoupled inductive plasma source, an ozone generator, a diode reactive sputter reactor, or a rapid thermal processing (RTP) chamber using short radiative excitation, for example, from a bank of incandescent lamps, in the presence of oxygen or ozone.

Figure 11:
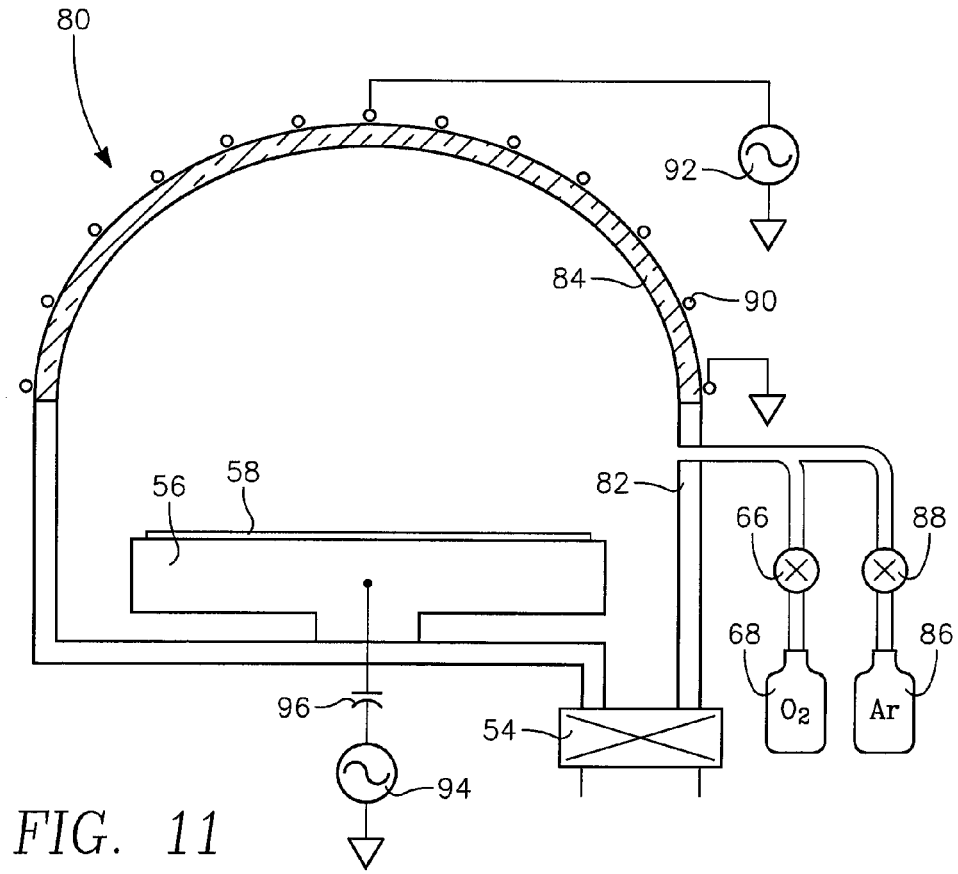
FIG. 11 is a cross-sectional view of a plasma oxidizing reactor which includes a local source of inductively coupled power for ex situ oxidation of the invention.

A plasma reactor 80, schematically illustrated in FIG. 11, may also be used for the oxidation although it is more typically used for pre-cleaning a wafer with an argon plasma. A vacuum chamber is formed by a main chamber body 82 and a dielectric dome 84. In addition to the oxygen supplied into the reactor 80 from the oxygen source 68, an argon source 86 supplies argon into the reactor 80 through another mass flow controller 88. The reactor 80 further includes an RF coil 90 wrapped around the dielectric dome 84 and powered by an source RF power supply 92 to create a plasma of the oxygen and argon within the reactor 80. The pedestal 56 may be coupled to a bias RF power supply 94 through a capacitive coupling circuit 96 to create a negative DC self-bias on the pedestal 56. The negative bias attracts and accelerates ions from the plasma to the wafer 58 to promote the oxidation.

A series of experiments were performed in the plasma reactor 80 for a post plasma treatment of an already deposited RuTa film having a thickness of less than 10 nm, a typical thickness for advanced vias. The film smoothness after treatment was observed for different oxygen fractions ranging from 0 to 50%. The wafer was biased during the plasma treatment. The results are summarized in TABLE 1, which presents the flows of argon and oxygen and the observed film smoothness, for which satisfactory film smoothness is marked an "X" and unsatisfactory film smoothness by an "O".

TABLE 1

| Ar (sccm) | $O_2$ (sccm) | Film Smoothness |
| --- | --- | --- |
| 100 | 0 | O |
| 100 | 5 | X |
| 100 | 10 | X |
| 100 | 20 | X |
| 100 | 30 | X |
| 100 | 50 | X |
| 100 | 100 | X |

Treatment with only a pure argon plasma does not adequately smooth the film. However, plasma treatment with any oxygen fraction of at least 5% adequately smooths the film. That is, the plasma treatment itself does not produce the desired smoothing. Instead, the already deposited metallic film needs to be oxidized.

Figure 12:
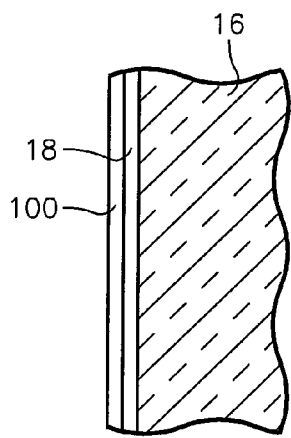
FIG. 12 is a cross-sectional view of a ruthenium tantalum oxide layer which is reactively sputtered onto a ruthenium tantalum layer.
Figure 13:
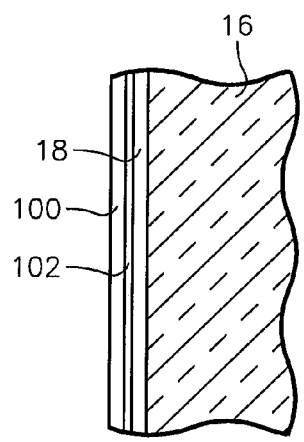
FIG. 13 is a cross-sectional view of a ruthenium tantalum oxide layer which is reactively sputtered directly onto a ruthenium tantalum layer.
Figure 14:
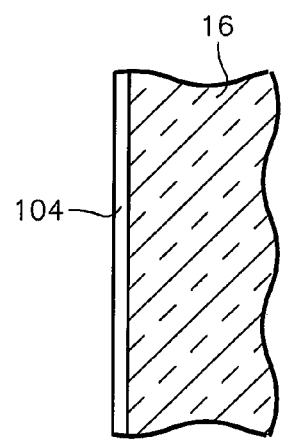
FIG. 14 is a cross-sectional view of a ruthenium oxide layer which is reactively sputtered onto a dielectric layer.

Rather than oxidizing an already deposited film, ruthenium tantalum oxide may be reactively sputtered, as illustrated in the cross-sectional view of FIG. 12, by sputtering a ruthenium tantalum target in the presence of oxygen to deposit a ruthenium tantalum oxide layer 100 over the ruthenium tantalum nitride layer 18. Reduced surface roughness is expected in the oxide layer 100 because. Alternatively as illustrated in the cross-sectional view of FIG. 13, an intermediate ruthenium tantalum layer 102 may be deposited on the ruthenium tantalum nitride layer 18 before the ruthenium tantalum oxide layer 100 is deposited. This structure may provide between total adhesion with the reaction of the metal layer with the nitride and oxide layer. In yet another embodiment, as illustrated in the cross-sectional view of FIG. 14, a ruthenium tantalum oxide layer 104 is reactively sputtered directly onto the dielectric layer 16, to which it should wet well because both are oxides.

Figure 15:
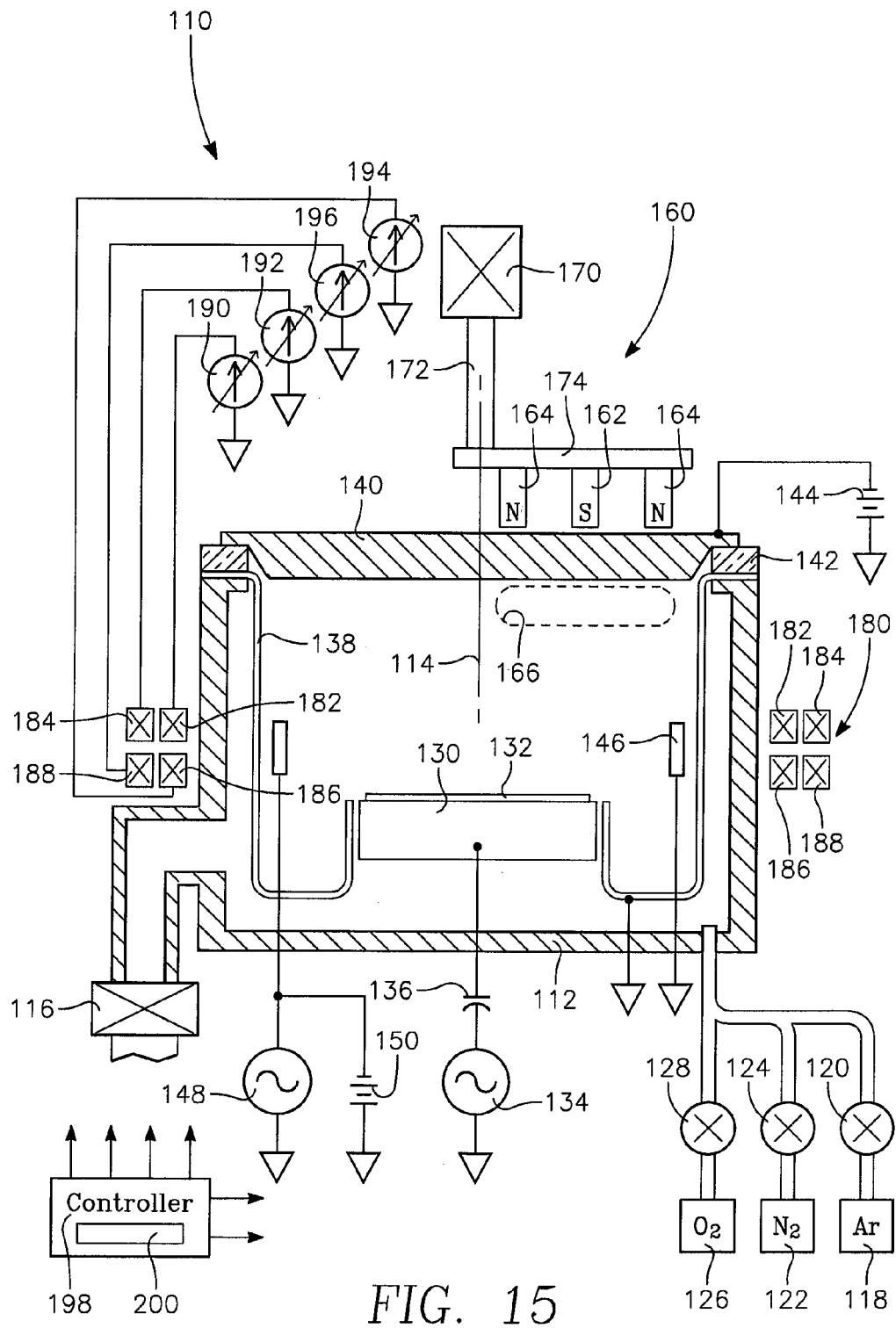
FIG. 15 is a schematic cross-sectional view of a plasma sputter chamber useful for in situ deposition of both a ruthenium tantalum nitride layer and a ruthenium tantalum oxide layer as well as sputter etching of the wafer.

It is possible to deposit the ruthenium tantalum and its nitride and oxide in one sputter chamber 110 schematically illustrated in cross-sectional view of FIG. 15. The reactive sputtering of ruthenium tantalum oxide is particularly use, as will be explained in detail later, when only partial oxidation of the metal oxide layer is desired. Gung et al. describe the details of sputter chamber 110 and its operation in U.S. patent application Ser. No. 11/119,350, filed Apr. 29, 2005 and published as U.S. published patent application 2005/0263390, incorporated herein by reference. Such a chamber is commercially available from Applied Materials, Inc. of Santa Clara, Calif. as the Endura II Ta(N) sputter chamber. The sputter chamber 110 is capable of sputter deposition into high aspect-ratio vias and of sputter etching the bottom of the vias to remove unwanted barrier material. The sputter chamber 110 includes a vacuum chamber 112 arranged generally symmetrically about a central axis 114. A vacuum pump system 116 pumps the vacuum chamber 112 to a very low base pressure in the range of $10^{-6}$ Torr. However, an argon gas source 118 connected to the chamber through a mass flow controller 120 supplies argon as a sputter working gas. The argon pressure inside the vacuum chamber 112 is typically held in the low milliTorr range. A nitrogen gas source 122 supplies nitrogen gas into the chamber through another mass flow controller 124 when a nitride is being reactively sputter deposited. An oxygen gas source 126 supplies oxygen gas into the chamber through yet another mass flow controller 128 when an oxide is being reactive sputter deposited.

A pedestal 130 arranged about the central axis 114 holds a wafer 132 or other substrate to be sputter coated. An unillustrated clamp ring or electrostatic chuck may be used to hold the wafer 132 to the pedestal 130. A bias RF power supply 134 is connected through a capacitive coupling circuit 136 to the pedestal 130, which is conductive and act as an electrode. In the presence of a plasma, the RF biased pedestal 130 develops a negative DC bias, which is effective at attracting and accelerating positive ions in the plasma. An electrically grounded shield 138 protects the chamber walls and the sides of the pedestal 130 from sputter deposition. A target 140 is arranged in opposition to the pedestal 130 and is vacuum sealed to the vacuum chamber 112 through an isolator 142. The front surface of the target 140 is composed of a metallic alloy of ruthenium tantalum of the desired compositional fraction for the material to be deposited on the wafer 132.

A DC power supply 144 electrically biases the target 140 to a negative voltage with respect to the grounded shield 138 to cause the argon working gas to discharge into a plasma such that the positively charged argon ions are attracted to the negatively biased target 140 and sputter ruthenium tantalum from it, some of which falls upon the wafer 132 and deposits a layer of the ruthenium tantalum target material on it. In reactive sputtering, reactive nitrogen or oxygen gas is additionally admitted from the respective sources 122, 126 into the vacuum chamber 112 react with the ruthenium tantalum being sputtered to cause the deposition of a tantalum ruthenium nitride or oxide layer on the wafer 132.

The sputter chamber 110 additionally includes an inductive coil 146, preferably having one wide turn wrapped around the central axis 114 just inside of the grounded shield 138 and positioned above the pedestal 130 approximately one-third of the distance from the pedestal 130 to the target 140. The RF coil 146 is supported on the grounded shield 138 or another inner tubular shield but electrically isolated therefrom, and two electrical leads penetrate the shield 138 and the sidewalls of the vacuum chamber 112 to power the RF coil 146. Preferably, the coil 146 is composed of tantalum so as to not contaminate the barrier deposition. At the present time, a more preferred ruthenium tantalum coil seems infeasible to fabricate. A coil RF power supply 148 applies RF current to the RF coil 146 to induce an axial RF magnetic field within the chamber and hence generate an azimuthal RF electric field that is very effective at coupling power into the plasma and increasing its density. The inductively coupled RF power may be used as the primary plasma power source when the target power is turned off and the sputter reactor is being used to etch the wafer 132 with argon ions or for other purposes. The inductively coupled RF power may alternatively act to increase the density of the plasma extending to the target 140. An optional coil DC power supply 135 may also be coupled to the RF coil 146 through an unillustrated RF/DC coupling circuit to effect electrostatic steering.

The target sputtering rate and sputter ionization fraction of the sputtered atoms can be greatly increased by placing a magnetron 160 in back of the target 140. The magnetron 160 preferably is small, strong, and unbalanced. The smallness and strength increase the ionization ratio and the imbalance projects a magnet field into the processing region for at least two effects of guiding sputtered ions to the wafer and reducing plasma loss to the walls. Such a magnetron includes an inner pole 162 of one magnetic polarity along the central axis 114 and an outer pole 164 which surrounds the inner pole 162 and has the opposite magnetic polarity. The magnetic field extending between the poles 162, 164 in front of the target 140 creates a high-density plasma region 166 adjacent the front face of the target 140, which greatly increases the sputtering rate. The magnetron 160 is unbalanced in the sense that the total magnetic intensity of the outer pole 164, that is, the magnetic flux integrated over its area, is substantially greater than that of the inner pole 162, for example, by a factor of two or more. The unbalanced magnetic field projects from the target 140 toward the wafer 132 to extend the plasma and to guide sputtered ions to the wafer 132 and reduce plasma diffusion to the sides. To provide a more uniform target sputtering pattern, the magnetron 160 is typically formed in a triangular, circular, closed-arced shape that is asymmetrical about the central axis 114, but a motor 170 drives a rotary shaft 172 extending along the central axis 114 and fixed to a plate 174 supporting the magnetic poles 162, 164 to rotate the magnetron 160 about the central axis 114 and produce an azimuthally uniform time-averaged magnetic field. If the magnetic poles 162, 164 are formed by respective arrays of opposed cylindrical permanent magnets, the plate 164 is advantageously formed of a magnetic material such as magnetically soft stainless steel to serve as a magnetic yoke. Magnetron systems are known in which the radial position of the magnetron can be varied between different phases of the sputtering process and chamber cleaning as described by Gung et al. in U.S. patent application Ser. No. 10/949,735, filed Sep. 23, 2004, now published as U.S. Patent Application Publication 2005/0211548, and by Miller et al. in U.S. patent application Ser. No. 11/226,858, filed Sep. 14, 2005, now published as U.S. Patent Application Publication 2006/0076232, both incorporated herein by reference in their entireties.

The sputter chamber 110 also includes a quadruple electromagnet array 180 positioned generally in back of the RF coil 146. The quadruple electromagnet array 180 includes four solenoidal coils 182, 184, 186, 188 wrapped generally circularly symmetrically about the central axis 114 of the reactor 110 although some recent developments have suggested the advantages of have one of the coils be offset to compensate for non-uniformities introduced by the RF coil 146 during the sputter etching mode. The coils 182, 184, 186, 188 are preferably arranged in a two-dimensional array extending around the central axis 114. The nomenclature is adopted of the top inner magnet (TIM) 182, top outer magnet (TOM) 184, bottom inner magnet (BIM) 186, and bottom outer magnet (BOM) 188. The coils 182, 184, 186, 188 may each be separately powered, for example, by respective variable DC current supplies 190, 192, 194, 196, which are preferably bipolar DC supplies. Corresponding unillustrated grounds or return paths are connected to the other ends of the multi-wrap coils 182, 184, 186, 188. However, in the most general case, not all the coils need be connected to a common ground or other common potential. Other wiring patterns are possible. Gillard et al. in U.S. patent application Ser. No. 11/610,075, filed Dec. 13, 2006, describes the encapsulation of the electromagnet array in a free standing structure and the modification of the chamber body to accommodate the transfer of the unitary electromagnet array on the chamber 112. A controller 198 controls the operation of the sputter chamber 110 according to a recipe for a desired process, typically containing multiple steps, contained in a recordable medium 200 inserted into the controller.

Even though it is not the primary method of the invention, the same sputter chamber 110 used to deposit the ruthenium tantalum layer may also be used to oxidize it by depowering the target 140, powering the RF coil 146, and admitting oxygen into the vacuum chamber 112 from the oxygen source 126 to thereby form an oxygen plasma adjacent the wafer 132.

In a more preferred method of the invention, the sputter chamber 110 of FIG. 15 has been used to deposit ruthenium tantalum and its nitride and oxide. During the metallic deposition step, no nitrogen or oxygen is admitted into the vacuum chamber 112. During the reactive nitride deposition, while the target 140 is being sputtered nitrogen is admitted into the chamber 112. During the reactive oxide deposition, while the target 140 is being sputtered oxygen is admitted into the vacuum chamber 112. Although some aspects of the invention apply to a Ru:Ta atomic fraction of between 1% and 99%, the experiments have focused on a Ru:Ta atomic fraction of above 50:50 to reduce the spontaneous oxidation of RuTa and to produce an electrically conductive oxide but it should be below about 90:10 to avoid the proneness to fracture in pure ruthenium. We believe RuTa atom fractions of between 70:30 and 90:10 provide the best fabrication and reliability in the applications being investigated.

Effective reactive sputtering of ruthenium tantalum oxide has been achieved with $O_2$/Ar supplied in fractions of 5% and above. It has been observed that the argon fraction can be reduced to zero, in which case oxygen is acting as the sputter working gas. However, the resultant film exhibited different characteristics than those produced with a finite argon fraction. A series of sputtering experiments were performed varying the oxygen partial pressure and measuring the film resistivity and observing the smoothness of a sputtered film having a thickness of less than 10 nm. The RuTa target had a Ru:Ta ratio of 90:10. The results are summarized in TABLE 2, in which the flows of argon and oxygen are tabulated and satisfactory film smoothness is indicated by an "X and unsatisfactory smoothness by an "O".

TABLE 2

| Ar (sccm) | $O_2$ (sccm) | Film Resistivity Shift | Film Smoothness |
|---|---|---|---|
| 4 | 0 | 0 | O |
| 4 | 2 | −10% | X |
| 4 | 4 | 8% | X |
| 4 | 10 | 27% | X |

The case of no oxygen flow, which is considered a baseline for the resistivity, showed unsatisfactory film smoothness. An oxygen fraction of 33% and higher produced satisfactory film smoothness. The decrease of film resistivity for an oxygen fraction of 33% is not completely understood. Further increases of the oxygen fraction were observed to increase the film resistivity. It is believed that it may result from the fact that the resistivity of $RuO_2$ at 40:Σ·cm is less than the resistivity of the RuTa alloy of 65:Σ·cm. It appears that partial oxidation of ruthenium, that is, $RuO_x$, where x<2, produces a lower resistivity than fully oxidized $RuO_2$.

Figure 16:
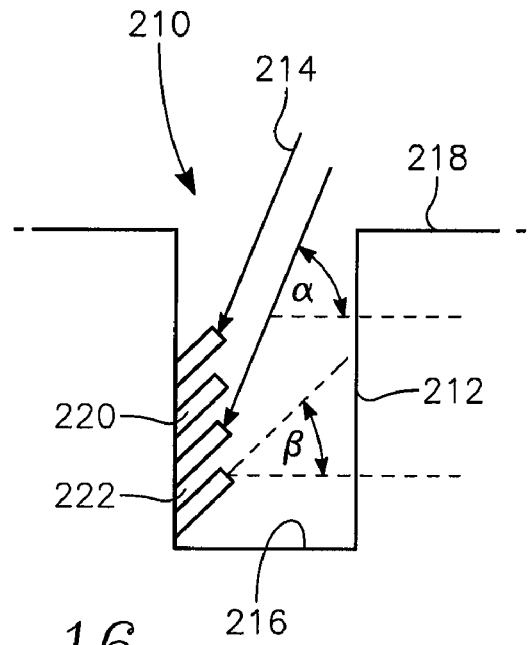
FIG. 16 is a schematic cross-sectional view of a via illustrating the column structure sputtered onto its sidewall.

It is further believed that reactive oxygen sputtering of Ta, Ru, and their alloys affects the crystallography and hence the electrical resistance of the refractory metal deposited on the via sidewall. As schematically illustrated in the cross-sectional view of FIG. 16, a via 210 includes vertical via sidewalls 212. Particularly the lower portion of the via sidewall 212 are accessible to sputtered metal atoms traveling along trajectories 214 inclined at an angle ∀ from the horizontal. For high-bias sputter deposition, these metal atoms are mostly low-energy neutrals. In contrast, a via bottom 216 is exposed to high-energy ions traveling almost vertically and a field area 218 on top of the substrate outside the via 210 is exposed to both the accelerated ions and the full angular flux of the neutrals. The differences in incident flux is reflected in the differing film morphology in different locations. The deposition in the field area 218 appears to be dense and smooth due to the broad angle of incident of the sputter flux. The deposition in the via bottom 216 also appears smooth because of the collimation by the high aspect-ratio via 210. However, the deposition on the via sidewalls 212 exhibit more prevalent formation of voids and tilted columnar structure. The low-energy neutrals impinging upon the via sidewall 212 tend to cause the sputter deposited metal to grow in columns 220 inclined at an inclination angle ∃ related to the incidence angle ∀ by $$\tan \alpha a = 2 \tan \beta,$$

The columns 220 tend to be crystallographically oriented with faster growth along the direction of the columns 220 with the exposed face developing a (001) crystallographic orientation of the hexagonal close packed crystal structure. A surface of this orientation has the highest atomic surface density and the lowest surface energy. However, gaps 222 tend to form between the columns 220 which are shielded from further sputter coating. A complementary structure develops on the opposed via sidewall 212 at the opposite inclination angle. We believe that a oxygen partial pressure less than that producing fully oxidized metal in the sputter deposited material increases the mobility of the metal atoms at the surface and sides of the columns 220. As a result, the limited oxygen facilitates the filling of the metal into the gaps 202, thereby increasing the conductivity of the sidewall barrier metal and decreases the surface roughness of the sidewall barrier, thus promoting later copper fill. The increase in conductivity is in addition to the increase in conductivity of the partially oxidized metal over the fully oxidized metal.

It is noted that the resputtering of the barrier material at the via bottom 216 also promotes the sidewall diffusion and oriented columnar growth as well as geometrically overcoming the self-shadowing.

The sputter chamber 110 of FIG. 15 can be effectively used for both sputter deposition and sputter etching of the wafer. It is possible to use a simpler sputter chamber lacking the RF coil and having simpler auxiliary magnets if any, particularly if sputter etching is not required.

Figure 17:
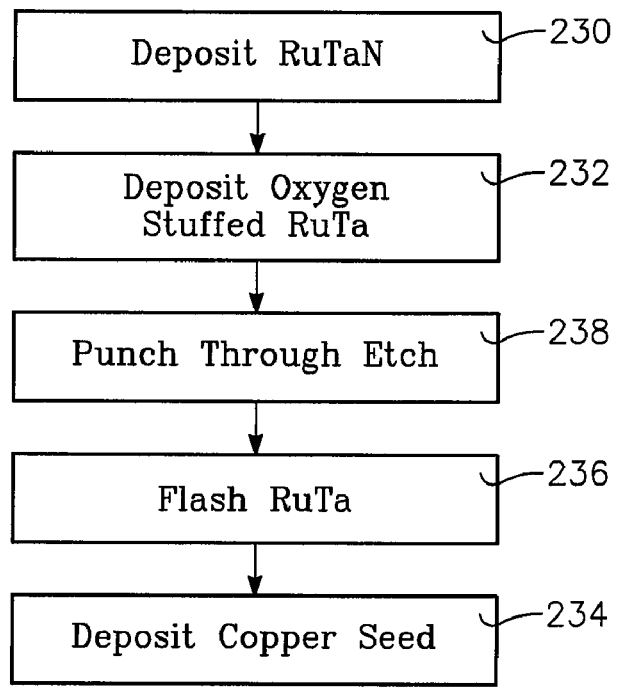
FIG. 17 is a process flow diagram explaining several embodiments of practicing the invention.

The invention may be practiced in several different processes. As illustrated in the flow diagram of FIG. 17, according to one process, in a nitride step 230, a RuTaN barrier layer is deposited onto the sidewall of the via, preferably by reactive sputtering of a RuTa target. In an oxide step 232, an oxygen-stuffed RuTa layer is deposited either by oxidizing a pre-deposited RuTa layer or by depositing directly a RuTaO layer. Preferably, either deposition step is performed by sputtering a RuTa target, which may be performed in the same sputter chamber as the nitride step 230. In the first case, a RuTa layer is sputter deposited; in the second case, a RuTaO layer is reactively sputter deposited. Steps 230, 232 may be sufficient for completing the barrier liner structure preparatory to depositing a copper seed layer in a copper seed step 234, preferably by sputtering a copper target in another chamber. However, the aggressive wafer biasing used for sputter depositing on the via sidewalls may have removed the barrier in the field area atop the wafer. Accordingly, in an optional flash step 236, flash ruthenium tantalum is sputter deposited with little if any wafer biasing so that the ruthenium tantalum coats the dielectric in the field region and further assures that the corners of the via are coated. It may be desired to remove the barrier material, whether it be RuTa or its nitride or oxide, at the bottom of the via. Accordingly, in an optional etch step 238, a punch through etch is performed, which may include little target power but RF coil excitation of an argon plasma and strong wafer biasing, so that the energetic ions etch the bottom but not the sidewalls of the via hole. However, they also etch the field region so that the punch through etch step 238 should be followed by the RuTa flash step 236. It is noted that under the proper conditions the oxidized ruthenium tantalum barrier may effectively act as an electroplating electrode so that the copper seed layer of step 234 may be eliminated.

The use of reactively sputtered ruthenium tantalum oxide allows several new barrier structures. The nitride barrier can be eliminated and ruthenium tantalum oxide can be sputter deposited directly on the dielectric, which is typically also an oxide, especially based on silicon oxide. The copper seed layer can be deposited on the ruthenium tantalum oxide layer or an intervening metallic ruthenium tantalum layer can be deposited in the same sputter chamber as the oxide. Also, the initial barrier layer may have a more complex composition of ruthenium tantalum oxynitride (RuTaON) by reactively sputtering ruthenium tantalum in an ambient of both oxygen and nitrogen. Such a layer provides both a good barrier and improved adhesion to the oxide dielectric.

The invention thus allows the formation of a thin but effective ruthenium tantalum barrier layer with relatively small additions to conventional fabrication processes and equipment.

The invention claimed is:

1. A method of depositing a barrier layer in a hole formed in a dielectric layer of a substrate, comprising:
   forming a layer of ruthenium tantalum oxide on a sidewall of the hole performed at least partially by sputtering a target comprising ruthenium tantalum, wherein the forming step comprises
   sputtering the target to form on the sidewall a first metal alloy layer comprising ruthenium tantalum and no effective amount of nitrogen, and
   oxidizing the first metal alloy layer including generating a plasma from a gas mixture and exposing the first metal alloy layer to the plasma, wherein the gas mixture comprises a sufficiently small amount of oxygen that an incompletely oxidized layer of ruthenium tantalum oxide is formed.

2. The method of claim 1, wherein the plasma is formed from a gas mixture comprising argon and at least 5% oxygen gas.

3. The method of claim 1, wherein the ruthenium tantalum oxide comprises $(Ru_y Ta_{1-y})O_x$, wherein $0<x<2$ and $0<y<1$.

4. A method of depositing a barrier layer in a hole formed in a dielectric layer of a substrate, comprising:
   forming a layer of ruthenium tantalum oxide on a sidewall of the hole performed at least partially by sputtering a target comprising ruthenium tantalum; and
   subsequently inductively coupling power into a chamber to which the target is affixed and containing an argon environment to excite an argon plasma to etch the substrate.

5. The method of claim 4, further comprising:
   the preceding step of sputtering the target to form a first metal alloy layer on the substrate; and
   the subsequent step of sputtering the target to form a second metal alloy layer on the substrate, wherein the substrate is less biased when the second metal alloy layer is formed than when the first metal alloy layer is formed.

6. The method of claim 1, wherein the target comprises ruthenium and tantalum in an atomic ratio between 50:50 and 95:5.

7. The method of claim 6, wherein the atomic ratio is between 70:30 and 90:10.

8. The method of claim 1, further comprising a preceding step of forming on the sidewall a barrier layer comprising ruthenium tantalum nitride by sputtering the target in the presence of nitrogen.

9. The method of claim 1, further comprising:
   coating a copper seed layer on the layer of ruthenium tantalum oxide; and
   plating copper into the hole over the copper seed layer.

10. The method of claim 4, wherein the forming step includes reactive sputtering the target in an ambient including oxygen and further comprising the preceding step of sputtering the target to form a first metal alloy layer on the substrate.

11. The method of claim 5, wherein the forming step includes reactive sputtering the target in an ambient including oxygen.

* * * * *